US009496681B2

(12) United States Patent
Vampa et al.

(10) Patent No.: US 9,496,681 B2
(45) Date of Patent: Nov. 15, 2016

(54) APPARATUS AND METHOD FOR TUNABLE GENERATION OF COHERENT RADIATION

(71) Applicant: University of Ottawa, Ottowa (CA)

(72) Inventors: Giulio Vampa, Ottawa (CA); Paul Corkum, Ottawa (CA); Thomas Brabec, Ottawa (CA)

(73) Assignee: University of Ottawa, Ottawa, Ontario (CA)

( * ) Notice: Subject to any disclaimer, the term of this patent is extended or adjusted under 35 U.S.C. 154(b) by 0 days.

(21) Appl. No.: 14/936,756

(22) Filed: Nov. 10, 2015

(65) Prior Publication Data

US 2016/0149371 A1     May 26, 2016

Related U.S. Application Data

(60) Provisional application No. 62/082,251, filed on Nov. 20, 2014, provisional application No. 62/248,372, filed on Oct. 30, 2015.

(51) Int. Cl.

| | |
|---|---|
| *H01S 3/10* | (2006.01) |
| *H01S 5/042* | (2006.01) |
| *H01S 5/04* | (2006.01) |
| *H01S 5/06* | (2006.01) |
| *H01S 3/109* | (2006.01) |

(Continued)

(52) U.S. Cl.
CPC ............... *H01S 5/0428* (2013.01); *G02F 1/35* (2013.01); *H01S 3/108* (2013.01); *H01S 3/109* (2013.01); *H01S 3/16* (2013.01); *H01S 3/1628* (2013.01); *H01S 5/041* (2013.01); *H01S 5/042* (2013.01); *H01S 5/0425* (2013.01); *H01S 5/0427* (2013.01); *H01S 5/0604* (2013.01)

(58) Field of Classification Search
CPC ........ H01S 3/109; H01S 3/108; H01S 3/163; H01S 3/1628; H01S 3/16; H01S 5/0428; H01S 5/0604; H01S 5/041; H01S 5/0427; H01S 5/0425; H01S 5/042
USPC .......................................................... 372/22
See application file for complete search history.

(56) References Cited

U.S. PATENT DOCUMENTS 7,664,147 B2 *   2/2010   Cohen .................... G02F 1/353
                                                        372/22
8,462,824 B2 *   6/2013   Popmintchev .......... G02F 1/353
                                                        372/21

(Continued)

OTHER PUBLICATIONS

Corkum. P. B. A plasma perspective on strong field multiphoton ionization. Phys. Rev. Lett.71, 1 9941997 (1993).

(Continued)

*Primary Examiner* — Kinam Park
(74) *Attorney, Agent, or Firm* — Miles & Stockbridge P.C.; Ajay A. Jagtiani (57) ABSTRACT

A method and apparatus is disclosed for generating tunable attosecond-scale radiation pulses, with a frequency in range of ultraviolet to soft-X-ray, from a solid-state medium. The invention utilizes an intense laser pulse to drive a high harmonic generation (HHG) process in a solid state medium and a weak secondary field to control the HHG process. The weak secondary field has a frequency equal to the second harmonic of the intense laser pulse. The spatial, temporal and spectral properties of the HHG process and the emitted harmonic beam are tuned by adjusting the relative delay between the two fields and the intensity of the weak secondary field.

23 Claims, 5 Drawing Sheets

(51) Int. Cl.
*H01S 3/108* (2006.01)
*H01S 3/16* (2006.01)
*G02F 1/35* (2006.01)

(56) References Cited

U.S. PATENT DOCUMENTS

2008/0137696 A1* 6/2008 Zhang .................. H01S 4/00
                                                    372/22
2011/0013653 A1* 1/2011 Krausz .................. G02F 1/3501
                                                    372/22

OTHER PUBLICATIONS

L'Huillier, A. & Balcou, P. High-order harmonic generation in rare gases with a 1-ps 1053-nm laser. Phys. Rev. Lett. 70, 774777 (1993).
Spielmann, Ch. et al. Generation of coherent soft X-rays in the water \Vindow using 5- fcmtosecond laser pulses. Science 278, 661-664 (1997).
Goulielmakis. E et al. Single-cycle nonlinear optics. Science 320, J 61 4-161 7 (2008).
Itatani, J. et al. Tomographic imaging of molecular orbitals. Nature 432, 86771 (2004).
Ghimire, S. et al. Observation of high-order harmonic generation in a bulk crystal. Nature physics 7, 138-141 (2011).
Schubert, O., et al. Sub-cycle control of terahertz high-harmonic generation by dynamical Bloch oscillations. Nature Photonics 8, 119-123 (2014).
Dudovich, N. et al. Measuring and controlling the birth of attosecond X UV pulses. Nature Physics 2, 781 786 (2006).
He, X. et al. Interference effects in two-color high-order harmonic generation. Physical Review A 82, 033410 (2010).
Ulstrup S. et al. Ultrafast dynamics of massive Dirac fermions in bilayer graphene. Phys. Rev. Lett. 112, 257401 (2014).
Keldysh, L. Ionization in the field of a strong electromagnetic wave. Soy. Phys. JETP 20.1 307-1314 (1965).
Corkum, P. & Krausz, F. Atlosecond Science. Nature Phys. 3. 381 87 (2007).
Wömer, H. J. Bertrand, J. B., Kartashov. D. V Corkum, P. B. & Villeneuve, D. M. Following a chemical reaction using high-harmonic interferometry. Nature 466, 604-607 (2010).
Smirnova, 0. et al. High harmonics interferometry of multi-electron dynamics in molecules. Nature 460, 972-977 (2009).
Brunel, F. Harmonic generation due to plasma effects in a gas undergoing multiphoton ionization in the high-intensity limit. JOSA B 7, 521-526 (1990).
Kemper, F., Moritz, B., Freerick, J. K., & Devereaux, T. P. Theoretical description of high-order harmonic generation in solids, New Journal of Physics 15, 023003 (2013).
Mücke, O. D. Isolated high-order harmonics puls4e from two-color-driven Block oscillations in bulk semiconductors. Phys. Rev. B 84, 081202 (2011).
Golde, D., Meier, T., and Koch, S. High harmonics generated in semiconductor nanostructures by the coupled dynamics of optical inter-and intraband excitations. Phys. Rev. B 77, 075330 (2008).
Vampa G. et al. Theoretical analysis of high harmonic generation in solids. Phys. Rev. Lett.113, 073901 (2014).
Wirth, et al. Synthesized light transients. Science 334, 195-200 (2011).
Krausz, F & Stockman, M. I. Attosecond metrology: from electron capture to future signal processing. Nature Photonics B, 205-213 (2014).
Shafir. D. et al. Resolving the time when an electron exits a tunnelling barrier. Nature 485, 343-346 (2012).
Hawkins, P. G. & Ivanov, M. Y. Role of subcycle transition dynamics in high-order-harmonic generation in periodic structures. Phys. Rev. A 87, 063842 (2013).
Schiffrin, A. et al. Optical-field induced currents in dielectrics. Nature 493, 70-74 (2013).

\* cited by examiner

APPARATUS AND METHOD FOR TUNABLE GENERATION OF COHERENT RADIATION

CROSS-REFERENCE TO RELATED APPLICATIONS

This application claims benefit of priority of U.S. Provisional Patent Application No. 62/082,251 entitled, "SOLID STATE SOURCE FOR ULTRASHORT BURST OF COHERENT UV AND VUV LIGHT THROUGH CONTROLLED GENERATION OF HIGH-ORDER HARMONICS IN SEMICONDUCTOR MEDIUM" filed Nov. 20, 2014; and U.S. Provisional Patent Application No. 62/248,372, entitled "GENERATION OF HIGH HARMONICS FROM SILICON," filed Oct. 30, 2015. The entire contents and disclosures of these patent applications are incorporated herein by reference in their entirety.

FIELD OF THE INVENTION

The present invention relates to non-linear light-matter interaction in solids. More specifically, the present invention is directed to controlled generation of high-order harmonics in solid-state media and applications of this control.

RELATED ART

Extracting information from fast-evolving phenomena requires probe signals that are shorter in duration than the time scale of the physical phenomena under study. As in stroboscopic photography, wherein the fastest motion that can be captured is defined by the camera shutter speed or the duration of the flash, accurate measurement of ultrafast phenomena are generally bound by the duration of the probe pulse. A laser pulse, for example, may be used as an optical probe for measurement of ultra-fast processes unraveling at molecular and atomic scales. The minimum achievable duration for an optical pulse is the time period of a single optical cycle. For standard lasers in infrared spectral ranges, this period corresponds to a few femtoseconds. A few femtoseconds are therefore the limit for the shortest pulse that can be generated with standard lasers. Breaching the attosecond atomic time scale barrier necessarily requires pushing the spectral region of operation from near-infrared (NIR) regime of standard lasers into the ultraviolet regime (VUV or XUV) and beyond.

Converting NIR photons (e.g. 1.6 eV) to much higher photon energies (e.g., 100 eV) requires a significant generation-energy boost. The necessary frequency up-conversion, required for generating ultraviolet range radiation from infrared range lasers, may occur when the optical response of a generating medium is driven into the non-linear regime. This may be accomplished, for example, through exposure to a very high intensity laser pulse. Any nonlinear system that is driven by an intense monochromatic field will respond at harmonic frequencies of the driving electromagnetic field. The harmonic response may stabilize over an extended range of harmonic-orders before it eventually drops off. Such a harmonic response profile, is characteristic of neutral atoms subjected to an intense electromagnetic field. When such an atomic medium is driven, for example, by an intense NIR laser pulse of central frequency $\omega_0$, it may exhibit a broadband emission profile consisting of several harmonics of the fundamental frequency $\omega_0$. The broadband emission profile may span a spectral range up to, for example, XUV and soft x-ray regime. This nonlinear strong-field optical process wherein a laser pulse of standard wavelength, such as infrared laser beam, is converted into coherent radiation in a much shorter wavelength regime, such as XUV or soft X-ray frequency regime, is known as high-order harmonic generation (HHG) process.

In the context of HHG, a laser pulse is considered strong when its electromagnetic field intensity approaches the characteristic atomic binding field strength, i.e., field strength or force experienced by electrons in the coulomb field of an atom in the generation medium. The strong electric field present at a laser focus will suppress the coulomb potential that holds the electron to the nucleus. The suppression of the coulomb potential facilitates a valence electron to tunnel through the potential barrier by a process known as strong field ionization. Following the ionization process the freed electron is accelerated in a trajectory away from its parent ion by the same electric field. When the oscillating electric field changes direction, during the negative half of the oscillation cycle, the electron trajectory is reversed. The electron is now accelerated back towards the parent ion by the electric field. On its way back the electron acquires a large amount of kinetic energy due to the strong acceleration imparted by the laser electric field. Upon re-collision and recombination with the parent ion the stored ionization energy and the kinetic energy of the electron, gained by its interaction with the laser field, is released as a radiation pulse.[1] This radiation pulse will have a frequency related to the harmonics of the driving laser field.[2] Since many electrons take part in this process, during each half-cycle of the laser field, there will be a broad distribution of possible trajectories and kinetic energies at recombination. This will correspond to multiple frequency components in the emission spectrum. The result is a broadband XUV emission with a typical spectrum of high-order harmonics.[3,4,5] If the radiation is continuous and phase locked, the corresponding temporal profile will be that of an attosecond pulse whose duration decreases as the number of combined harmonics increases. The attosecond time-scale of the pulse emerges as a result of coherent superposition of harmonic orders of the fundamental frequency ($\omega_0$). Since this coherent process occurs at every half cycle of the periodic drive laser, the XUV emissions will be characterized by a series of attosecond-scale bursts separated in the time domain by half the laser period, i.e., ½T. The corresponding frequency domain representation is that of a harmonics frequency comb consisting of frequency peaks (harmonics) separated by twice the fundamental frequency, i.e., $2\omega_0$. The consecutive bursts correspond to respective electron-ion collisions emanating from opposite directions (due to being driven by opposite polarity half cycles of the oscillating laser field.) This results in the emission of spectral components with opposite phases (but the same amplitude due to the inversion-symmetric property of the generating medium.) The upshot is inherent destructive interference of the even-order harmonics (interchangeably referred to as even harmonics) and constructive interference of the odd-order harmonics (interchangeably referred to as odd harmonics.) Consequently, even-order harmonics are erased and only odd-order harmonics are observed in the standard HHG spectrum.

In principle a broad spectral width enables the formation of attosecond pulses. Following the identification of electron-ion re-collision as the primary interaction underlying HHG from atomic gas-based medium, experimental techniques have been developed to modulate the interaction to thereby tune and enhance the harmonic response of the atomic gas-based medium. These techniques are typically based on shaping the intensity profile of a driving field to thereby influence and modify the spectral phase of the resulting high harmonic emissions (i.e., enhance the harmonic bandwidth generated through the laser-driven electron-ion re-collision process).[6,7,8,9,10,11]

Since the first observation of high-order harmonics about two decades ago, much of the relevant effort has been directed toward the theoretical study, analysis and experimental realization of the HHG technology in gas-phase medium.[12,13,14] HHG implementation in gaseous medium has been the domain of primary progress in the field. Consequently, relative to solid-state domain, HHG in gases is far more developed and in widespread application today. Motivated, in part, by the deficiency in understanding of the HHG process in solid-state medium, one aspect realized by the present invention cultivates a detailed insight into the emission mechanism underlying HHG in solids and solid-state medium by building upon the established similarity in the strong-field ionization response of solids and gases. Furthermore, disclosed embodiments seek to identify, characterize and experimentally verify the dominant interaction underlying high-order harmonic generation in solids and solid-state medium. Other embodiments of the present invention disclose an operational platform and methodology for in-situ generation, measurement and manipulation of broadband emission of coherent XUV radiation and tunable attosecond pulse formation in solid-state medium (i.e., semiconductor substrate). Accordingly, it is a goal of the present invention to expand the scope and extend the commercial relevance and applicability range of the HHG technology.

Disclosed embodiments of the present invention provide novel methods, systems and applications enabled by a solid-state based (i.e., semiconductor-based) implementation of broadband coherent XUV radiation and tunable attosecond pulse formation, accomplished via controlled high harmonic generation from solid-state matter (i.e., semiconductor generation medium.)

SUMMARY

According to first broad aspect, the present invention provides a method comprising applying a driving electromagnetic field having a first frequency and a first intensity to a solid-state medium to thereby trigger a high harmonic generation process in the solid-state medium. The high harmonic generation may process results in a generation of a harmonic beam from the solid-state medium. The harmonic beam may comprise a plurality of high-order harmonics of the first frequency. The method may apply a control field having a second frequency, a second intensity and a relative phase with respect to the driving electromagnetic field to an interaction region of the electromagnetic field and the solid-state medium to thereby control one or more spectral, temporal and spatial properties of the harmonic beam generated from the solid-state medium.

According to a second broad aspect, the present invention provides an apparatus comprising a semiconductor generation medium comprising a semiconductor-laser interaction region; a first input configured to focus a drive laser field onto the semiconductor-laser interaction region to thereby initiate a high harmonic generation process in the semiconductor-laser interaction region; a second adjustable input for introducing a control field onto the semiconductor-laser interaction region to thereby control the high harmonic generation process, wherein the control field spatially and temporally overlaps the drive laser field. The apparatus may also comprise an output for directing a signal generated from the semiconductor-laser interaction region onto one or more terminals, wherein the signal comprises one or more high harmonics.

BRIEF DESCRIPTION OF THE DRAWINGS

The accompanying drawings, which are incorporated herein and constitute part of this specification, illustrate exemplary embodiments of the invention, and, together with the general description given above and the detailed description given below, serve to explain the features of the instant invention.

DETAILED DESCRIPTION OF THE PREFERRED EMBODIMENTS

Definitions

Where the definition of terms departs from the commonly used meaning of the term, applicant intends to utilize the definitions provided below, unless specifically indicated.

For purposes of the present invention, it should be noted that the singular forms, "a," "an" and "the," include reference to the plural unless the context as herein presented clearly indicates otherwise.

For purposes of the present invention, directional terms such as "top," "bottom," "upper," "lower," "above," "below," "left," "right," "horizontal," "vertical," "up," "down," etc., are used merely for convenience in describing the various embodiments of the present invention. The embodiments of the present invention may be oriented in various ways. For example, the diagrams, apparatuses, etc., shown in the drawing figures may be flipped over, rotated by 90° in any direction, reversed, etc.

For purposes of the present invention, a value or property is "based" on a particular value, property, the satisfaction of a condition or other factor if that value is derived by performing a mathematical calculation or logical operation using that value, property or other factor.

For purposes of the present invention, the term "AC field" refers to a periodically or non-periodically varying electric field.

For purposes of the present invention, the term "characteristic atomic binding field strength" refers to the atomic field strength keeping outer most electrons bound to the parent atom. In order for an impinging electromagnetic field to ionize the atom it must have a field strength equal to or in excess of the characteristic atomic binding field strength.

For purposes of the present invention, the term "DC field" refers to a constant electric field.

For purposes of the present invention, the term "drive laser" may be used interchangeably with the term "driving laser".

For purposes of the present invention, the term "driving field" or "drive field" refers to the electric field associated with a driving laser and may be used interchangeably with the terms "driving laser field" or "drive laser field".

For purposes of the present invention, the term "driving laser" refers to the fundamental signal, if the fundamental signal is a laser pulse.

For purposes of the present invention, the term "fundamental field" refers to the electric field associated with a fundamental signal.

For purposes of the present invention, the term "fundamental frequency" refers to the frequency of the fundamental signal.

For purposes of the present invention, the term "fundamental signal" refers to a signal that non-linearly interacts with a medium in order to produce high-order harmonics of the fundamental signal frequency from the medium.

For purposes of the present invention, the term "high-order harmonic" refers to the high integer multiples of the fundamental signal.

For purposes of the present invention, the term "interaction region" refers to the region where a fundamental signal interacts with a medium in order to generate high-order harmonics of the fundamental signal from the medium.

For purposes of the present invention, the term "laser-driven electron-ion re-collision process" refers to the electron re-collision process underlying the high harmonic generation process when such a process is driven by a laser signal.

For purposes of the present invention, the term "modulated" refers to the act, effect, outcome or condition of modulation upon a signal.

For purposes of the present invention, the term "modulation" refers to any type of modification or alteration brought upon or imposed onto the spatial, temporal or spectral properties of a signal.

For purposes of the present invention, the term "nano-plasmonic features" refers to any feature that produces/controls/modifies or is subjected to one or more plasmonic events at the nano scale.

For purposes of the present invention, the term "nano-plasmonic" refers to the plasmonic effect that occurs at the nano scale.

For purposes of the present invention, the term "optical signal" refers to an electromagnetic signal with a wavelength range extending from Infra-red to X-ray regime.

For purposes of the present invention, the term "plasmonic" refers to an effect or condition that involves or is related to the collective oscillation of conduction-band electrons in a medium in response to an electromagnetic field.

Description

While the present invention is disclosed with references to certain embodiments, numerous modification, alterations, and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof. It is understood that other embodiments may be utilized and structural changes may be made without departing from the scope of the invention.

Electron-hole pair creation by high order multiphoton transitions (often approximated as tunnelling), followed by the motion of the electrons and holes within and between their respective bands is the fundamental mechanism underlying strong-field light matter interactions and harmonic generation. In atoms, the motion of the electron can be characterized by two different dynamics. In one, known as intra-band transition, the newly freed electron undergoes oscillatory motion in the presence of the applied electric field.[17] In the other, illustrated in FIG. 1, the freed electron undergoes a boomerang type trajectory that results in re-collision and recombination of the electron with its associated hole (parent ion) and emission of a high energy photon as a consequence of the process. Since both dynamics involve the formation of an oscillating dipole, they are both potential sources of harmonic radiation. In gaseous medium the former dominates low-order harmonics generation while the latter dominates high-order harmonics generation. In the case of high-order harmonic generation (HHG) in solids, contributions from both dynamics must be considered.

Intra-band transition in solids deviates from the free electron model in gases. Due to the interaction of the electron with the lattice, the electron motion does not follow the sinusoidal motion of the electric field.[15,16,17] HHG model in solids must, therefore, include both mechanisms[18,19], namely the non-sinusoidal electron dynamics, and the electron-ion re-collision dynamics following a high-field ionization process. HHG processes in solid-state medium may be used as a diagnostic tool for studying, for example, the ultrashort temporal and spatial dynamics and probing attosecond time-scale phenomena associated with solid-state electronics. In order to understand, control and ultimately exploit the potential of the HHG process as a solid-state based diagnostic tool, the primary physical mechanism for high-order harmonics generation in solids such as, for example, a semiconductor generation medium must be identified.

In accordance with one aspect of the present invention a mid-infrared (MIR) laser pulse is used to study a response of a Zinc oxide (ZnO) based semiconductor medium to an incident high-intensity field. Short emission bursts corresponding to odd-ordered harmonics of the fundamental frequency of the MIR laser are recorded. This observation demonstrates successful generation of high-order harmonics from a semiconductor medium. Emissions corresponding to even-order harmonics of a driving field are observed when a driving field, introduced, for example, via a first input is perturbed with a weak secondary control field introduced, for example, via a second adjustable input. The secondary control filed may have a frequency equal to the second harmonic of the fundamental frequency (frequency of the driving field.) Further control over the high-order harmonic generation process is demonstrated by utilizing the adjustable input to variably delay the second-harmonic control field relative to the fundamental field. Modulation of the relative delay between second-harmonic control field and fundamental field results in modulation in the strength of the observed even harmonics emitted from the semiconductor medium. It is experimentally observed that the phase of the modulation as a function of harmonic order determines the spectral phase (emission time) of the emitted harmonic beam. This observation facilitates the characterization of physical mechanism underlying the HHG process in the semiconductor-based medium such as, for example, ZnO.

Similar results, namely controlled generation of high harmonics and characterization of the underlying generation mechanism, are demonstrated for a silicon-based semiconductor medium, for example, as described in U.S. Provisional Patent Application No. 62/248,372, entitled "GENERATION OF HIGH HARMONICS FROM SILICON," filed Oct. 30, 2015, the entire content and disclosure of which is incorporated herein by reference in its entirety. It should be noted that the second-harmonic control field may have an internal or an external source, i.e., it may be applied through one or more internal terminals fashioned on the surface or within the bulk of the semiconductor medium, or applied through one or more external terminals coupled to one or more external sources.

As stated earlier, strong-field assisted electron tunneling[11] and the subsequent motion of the electron in the continuum, followed by a possible re-combination of the electron-hole pair is the fundamental mechanisms underlying HHG process. Due to its quantum nature, the interaction is governed by the phase of the released electron wave-packet. Therefore tracking the dynamics of the electron wave packet (from ionization to field-driven acceleration to radiative recombination with the parent ion) by way of treating HHG as a balanced electron interferometer, may help to elucidate the above-stated experimental observations.

Figure 1:
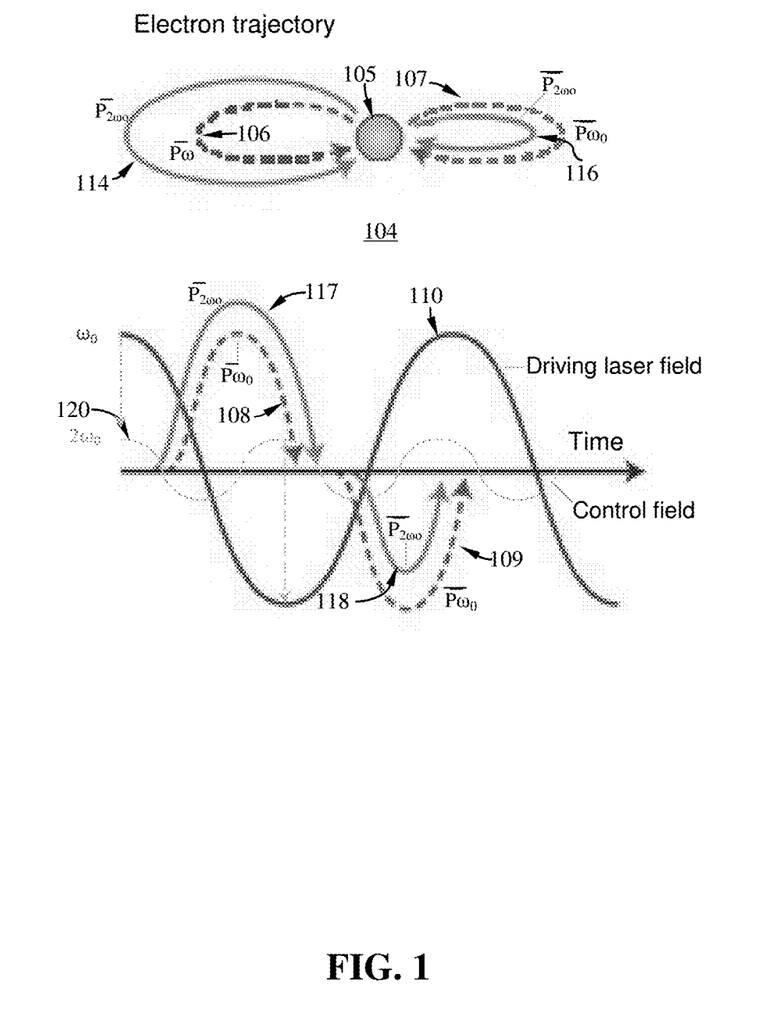
FIG. 1 is a pictorial representation of an electron's trajectories and field profiles for two successive half-cycles of a fundamental field in presence of a second-harmonic control field, according to one embodiment of the present invention.

Initially, an intense laser field removes an electron from its host atom, splitting the wave function into a coherent superposition of a bound state and a free-electron wave packet. In the language of interferometry, ionization process acts as an effective beam splitter. Next, the free-electron wave packet moves in the oscillating laser field and returns to the parent atom during the negative half of the driving field oscillation cycle. This effectively corresponds to an adjustable delay line. Finally, during the re-collision, the two portions of the wave function overlap. The characteristics of the resulting interference (time-dependent dipole moment) are encoded in the output attosecond radiation pulse emitted from a generation medium. The amplitude, energy and phase of the re-collision electron are transferred to the emitted radiation pulse through the dipole moment (energy transition). The control of the spectral properties, temporal properties and spatial properties of the HHG process, and by extension those of the emitted harmonic beam, requires manipulating electron trajectories on attosecond time-scale. Trace diagrams 102 and 104 in FIG. 1, illustrate an electron's propagation paths (trajectories) 106 and 107 when a host atom 105 experiences a symmetric electric field, as illustrated by positive and negative half-cycles 108 and 109, respectively. Half-cycles 108 and 109 represent an electric field cycle experienced by a host atom 105 upon which a driving laser field 110 is incident. Hence forth, driving laser field 110 may be interchangeably referenced as fundamental field 110. As can be observed from trace diagram 102, electron propagation paths 106 and 107 are symmetric in response to the symmetric profile of half-cycles 108 and 109. As such the left and right arms of the interferometer are balanced.

Due to the non-linear nature of the strong-field light-matter interaction, small perturbations in the driving laser field 110 may result in large changes in harmonic behavior of a generating medium (of which host atom 105 is a part). Solid trace 114 and 116 illustrate the expected alterations in the propagation paths (trajectories) of an electron when an electric field experienced by host atom 105 is altered as illustrated by the asymmetric profile of positive and negative half-cycles 117 and 118, respectively. The alteration is due to the perturbation of driving laser field 110. The perturbation, in this case, is introduced in form of a weak secondary control field 120 with a frequency corresponding, for example, to the second harmonic of the fundamental frequency $\omega_0$ (frequency of the driving laser field 110). The secondary control field 120, henceforth referred to as second-harmonic control field, unbalances the interferometer by increasing or decreasing the electron propagation path (trajectory) by a small amount, thus adding or removing a small amount of phase to each arm of the interferometer. As a result, the phase accumulated by the propagating electron (propagation path 114) is enhanced in the half cycle 117 when the fundamental field 110 and the second-harmonic control field 120 are appropriately phased (similarly phased). Similarly, phase accumulated by the propagating electron (propagation path 116) is suppressed in the adjacent half cycle 118 when the fundamental field 110 and the second-harmonic control field 120 are oppositely phased. The shape of the electric field experienced by an atom (represented by trace 108, 118 and 117, 118) is variably modulated by changing the relative delay (relative phase) of the second-harmonic control field 120 with respect to the fundamental field 110. This alters the interference profile between the second-harmonic control field 120 and the fundamental field 110. The relative phase (relative delay) that maximizes the strength of the emitted harmonics carries information related to the phase of the interfering electron wave-packets.

Amplitude and spectral phase of the emitted harmonic radiation carries the complete information about the harmonic generation process. By tuning the temporal profile of driving laser field 110 to a known state, phase and amplitude distribution of the generated high-order harmonics, and by extension the time-domain characteristics of the isolated ultrashort radiation pulse, may be predicted.

Figure 2:
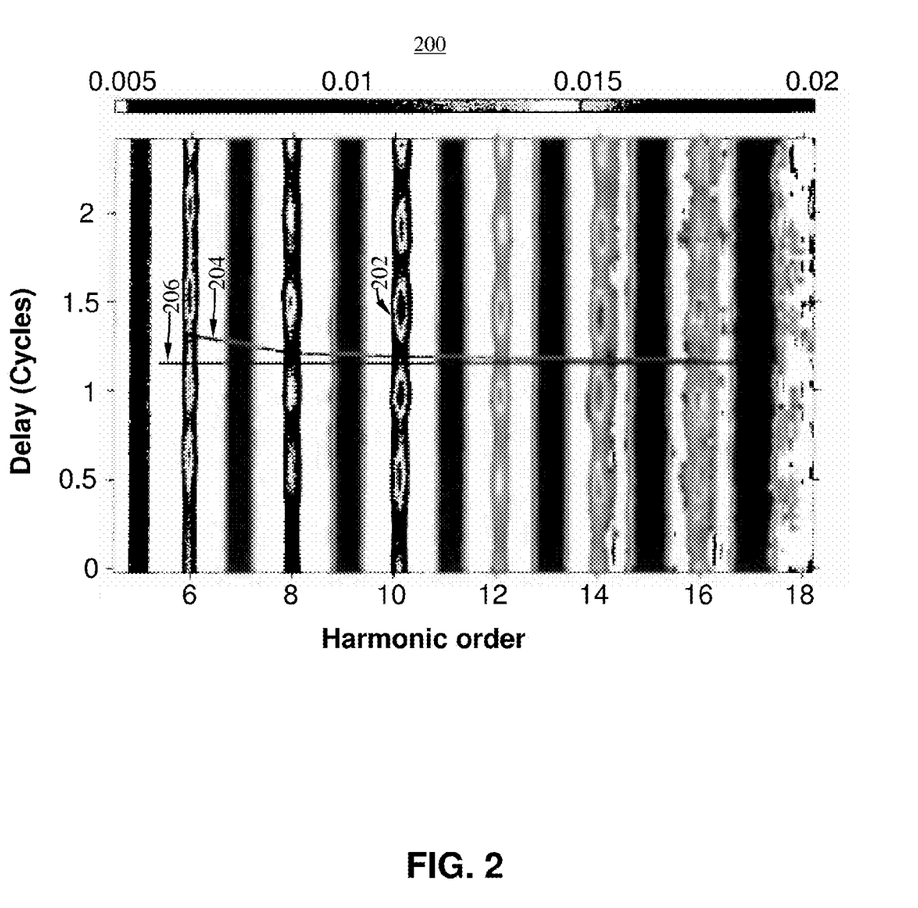
FIG. 2 illustrates the measured high harmonic spectra versus the relative delay between the two color fields (fundamental or drive field and second-harmonic control field), according to one embodiment of the present invention.

FIG. 2 illustrates the emitted high harmonic spectrum versus the relative phase (delay) between the two color fields (fundamental field and the second-harmonic control field), with the second-harmonic control field intensity set at $9*10^{-6}$ of the fundamental field intensity level. The delay of the second-harmonic control field is defined in terms of the cycles of the fundamental field. Weak even harmonics are visible between the strong odd harmonics. At its peak an even harmonic, for example, even harmonic 202 at $10^{th}$ harmonic order, is approximately 15% of the adjacent odd harmonic. According to FIG. 2 the even harmonic intensity modulates with the delay between the fundamental field and the second-harmonic control field, at every half cycle of the fundamental field. The odd harmonics intensity is also modulated, but the modulation is not readily observed because they saturate the color scale of the display instrument used in the measurement. Comparison of the grey line 204 with the reference line 206 in FIG. 2 further demonstrates that the phase modulation of the even harmonics (determined by the relative phase difference or delay between the second-harmonic control field and the fundamental field that maximizes the strength of the respective even harmonic), depends on the harmonic order. The weak second-harmonic control field modifies the electron wave packet between the moment of ionization and the moment of re-collision, thus modulating the emitted harmonic spectrum. Measuring the modulation of the even harmonics versus phase delay (relative phase between the control field and the fundamental field) measures the order-dependent relative phase that maximizes the intensity of each even harmonic as explained above. This parameter, denoted as $\phi_{max}(2N)$, where N represent the harmonic order, may be used to extract the emission time of each even-order harmonic or equivalently, the spectral phase of the attosecond pulses. The emission time of odd-order harmonics may similarly be extracted by measuring the order-dependent relative phase that maximizes the intensity of each odd-order harmonic.

Figure 3:
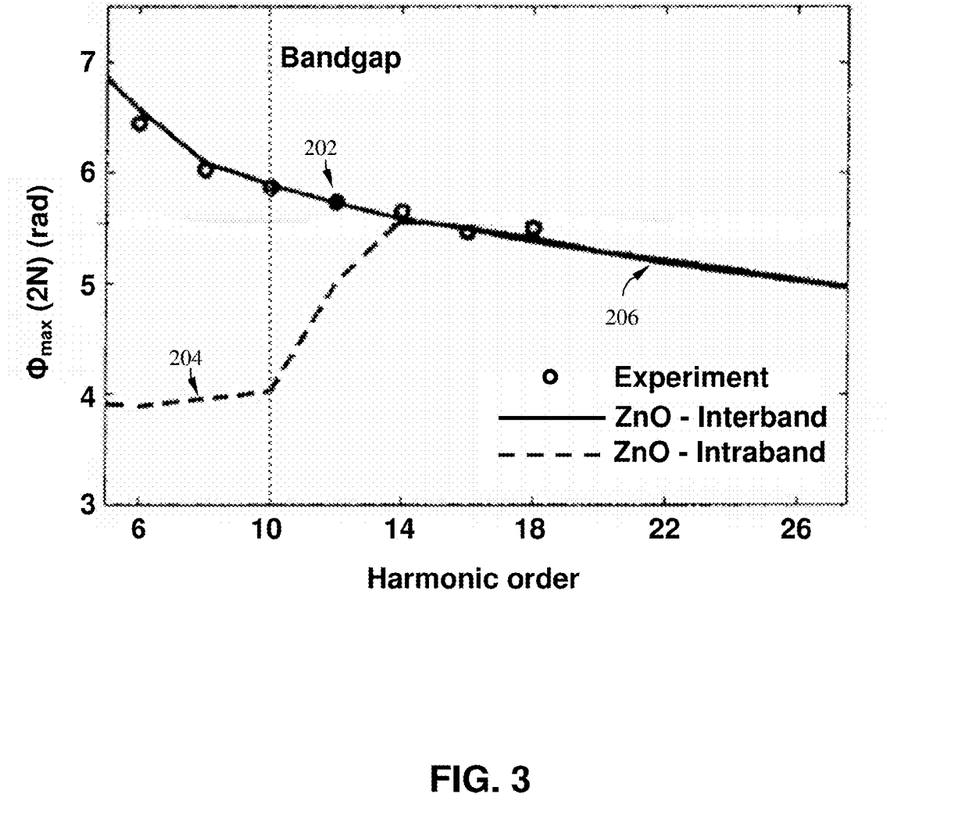
FIG. 3 is a graphic illustration of the extracted data from FIG. 2 showing the modulation phase that maximizes the intensity of a respective harmonic order, as a function of the harmonic order, according to one embodiment of the present invention.

In FIG. 3, the $\phi_{max}(2N)$ parameter, extracted from the measurements illustrated in FIG. 2, is plotted as a function of the harmonic order up to the cut-off of the measuring spectrograph, and depicted as a set of circular data points 202. An unmeasured constant phase is used to position the experimental data (this constant phase is measurable using nonlinear optical methods). Trace 204 represents the theoretical values of $\phi_{max}(2N)$, plotted for the intra-band sources, corresponding to harmonics that arise from the oscillatory motion of the newly freed electron in the laser field. Trace 206 represents the theoretical values of $\phi_{max}(2N)$, plotted for interband sources, corresponding to the re-collision and recombination of the ionizing electron with its associated "hole" (parent ion). Satisfactory agreement between experiment, illustrated by data points 202, and theoretical calculation of interband emission, illustrated by trace 206, is achieved. The disclosed measurements in FIG. 2 and FIG. 3 provide verification of electron re-collision as the dominant mechanism for high-order harmonic emission in an exemplary semiconductor medium such as, for example, ZnO.

The slope of the curves in FIG. 3 is determined by both the intensity of the fundamental field and the band structure of the generating medium such as, for example, a dielectric crystal. The dispersion of the wave packet in a crystal medium has two major consequences: first, the electron-hole pair accumulates much more phase, approximately 50π, relative to that of the free electron wave packet in gaseous medium which is approximately 10π. As a result, it is easier to break the symmetry of the electron propagation path in a crystal medium, using a control field, for example, as low as approximately $10^{-5}$ of the fundamental field (i.e., five orders of magnitude less that the fundamental field intensity). Second, it determines the duration of the high harmonic pulses. Initial measurements produce a harmonic chirp of approximately 0.38 fs/eV at the $16^{th}$ harmonic, corresponding to a train of pulses with duration of 1.7 femtosecond (before dispersion compensation) for a 2 eV bandwidth. Wider bands and higher intensities will result in smaller chirps, thereby allowing attosecond pulse generation from a solid medium.[20]

Figure 4:
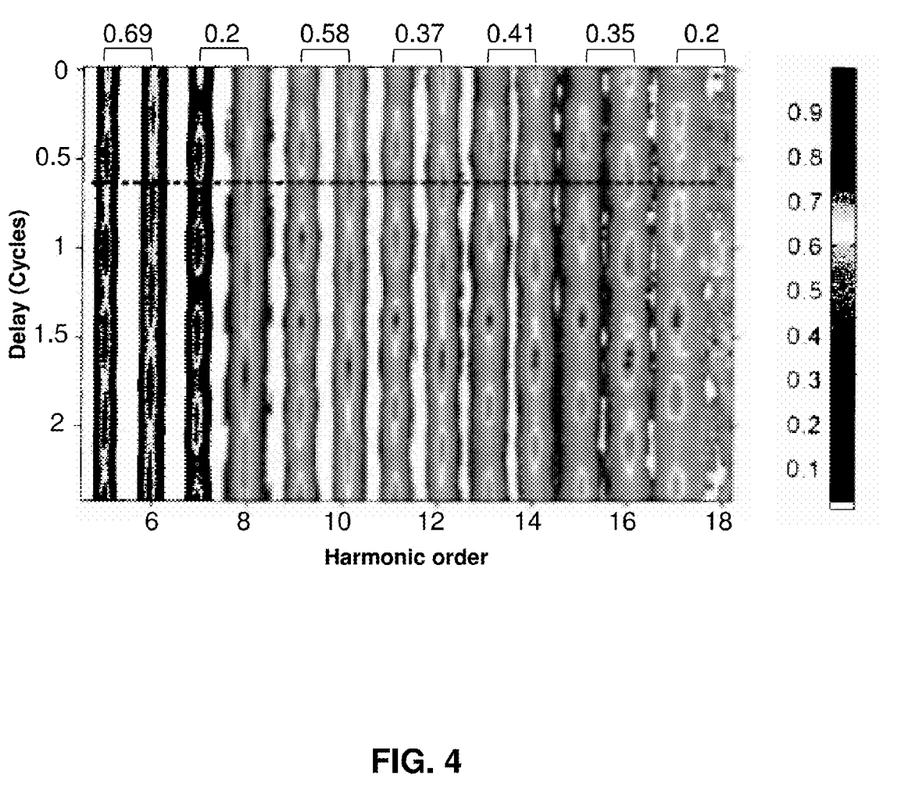
FIG. 4 illustrates an out of phase modulation of the even and odd harmonics when the intensity of the second-harmonic control field is $1*10^{-4}$ of the fundamental field, according to one embodiment of the present invention.

As the control field intensity is increased the action moves from perturbing to controlling of the high harmonic generation process and the harmonic emissions. FIG. 4 illustrates how the harmonic emission spectrum is modified when the intensity of the second-harmonic control field is increased to approximately $10^{-4}$ of the fundamental field. At this intensity of the control field, even and odd harmonics modulate out of phase. Alternation between even and odd harmonics occurs when the second-harmonic control field modulates the re-collision electron phase by π/2.

Figure 5:
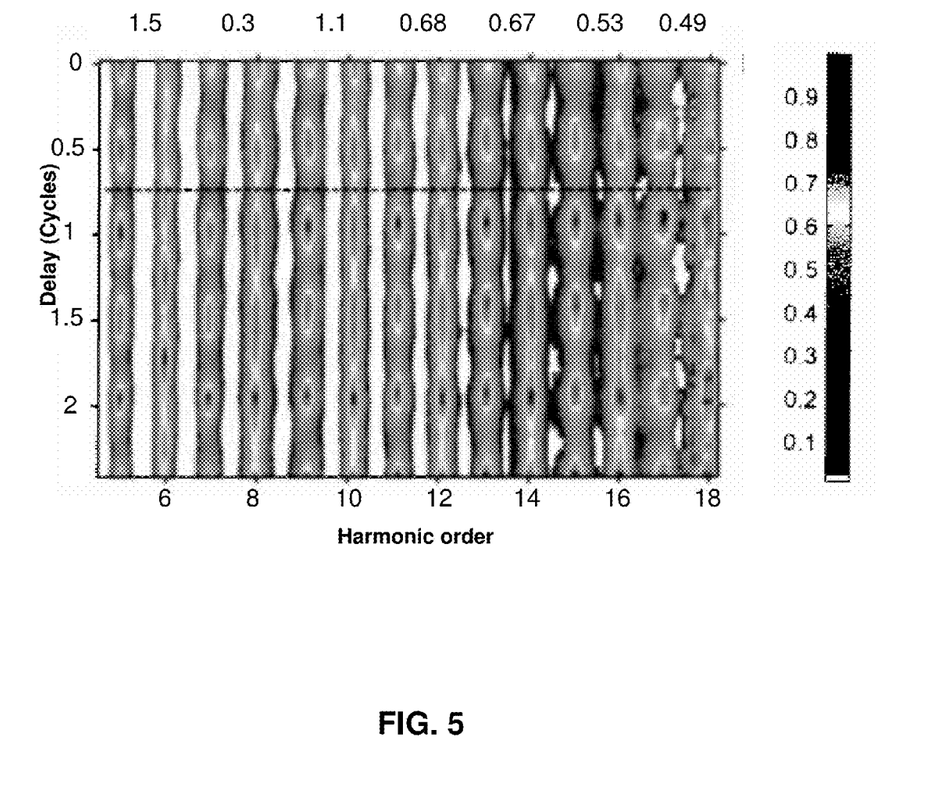
FIG. 5 illustrates the in phase modulation of all harmonics when the intensity of the second-harmonic control field is increased to $3*10^{-3}$ of the fundamental field, according to one embodiment of the present invention.

At even higher second-harmonic control field intensity levels, high-order harmonic generation is substantially modified. In the highly asymmetric sum filed, ionization only occurs once per laser cycle. This leads to simultaneous emission (or suppression) of even and odd harmonics. FIG. 5 illustrates in-phase modulation of all harmonics as the second-harmonic control field intensity level is increased to $3 \times 10^{-3}$ of the fundamental field. This is important because it simplifies the generation of isolated, ultrashort (attosecond) pulses which is achievable only by making use of the full high-order harmonic spectrum.

Control can rely on interference in space rather than time. By suitable modification of the second-harmonic control field phase front, the harmonic beam in the far field can be manipulate at will, effectively enabling functionalities associated with lenses, beam splitters, diffraction gratings and spatial light modulators. In situ optical elements can be remarkably useful for future studies of solid state dynamics or ex situ experiments with the harmonic beam. Due to the weak control field (second harmonic field) required, it is plausible that DC or pulsed electric fields[21] applied, for instance, by electrodes on the crystal, can perform the same task.

Taken together, the forgoing provides strong evidence for controlled high-order harmonic generation in solids. The relative phase of the modulation between even and odd orders reveal detailed information on the time-dependent electron tunneling rate.[22] Odd harmonics also show a weak modulation in solids. Transfer of this second in situ method to solids will allow the resolution of electronic sub-cycle temporal response to strong fields.[23,24]

Demonstrating the dominant role of electron re-collision in high-order harmonic generation in solids renders them an important medium for attosecond technology. For example, in gases, in situ probing allows for measurement of the field of a light pulse. It is the brief life of the re-collision electron in the continuum that provides the ultrafast gate. In accordance to one aspect of the present invention a theoretical and empirical frame work for implementing similar in situ measurement in a solid is disclosed, thereby making the light-wave technology more easily transferable to the larger scientific community. It should be noted that a solid medium may comprise a crystal having a crystalline structure, a dielectric material, polymer material, biological material or it may comprise a thin slice of biological material as a sample.

In summary, non-linear light-matter is essential in probing materials and their dynamics. Until now only perturbative probing methods have been used for solids. In accordance to one embodiment of the present invention a methodology and a system for controlled generation of high harmonics from transparent solids and solid-state medium is disclosed. This enables the adaptation and application of well-developed non-perturbative methods from atomic physics to condensed matter. For example, a re-collision electron inevitably carries information about its origin[5] and the band structure of the material through which it travelled. This information is encoded in the emitted harmonic spectrum. This will enables, for example, the reconstruction of a material's 3D momentum-dependent band structure from measurements of $\phi_{max}(2N)$ as a function of crystal orientation.

The ease of delivery and application of the attosecond XUV pulse that is generated and controlled directly in a semiconductor substrate can significantly simplify and enhance analysis, diagnostic and metrology for a large array of solid-state integrated systems. Furthermore, realization of controlled HHG in semiconductor medium enables co-integration of these complex functionalities in the same substrate as optical and electronic processing and readout modules, thus enhancing the capabilities of the current solid-state based applications while creating avenues for entirely new applications and novel technological solutions.

One embodiment of the present invention discloses a method for high resolution dynamic imaging of integrated circuits. Semiconductor circuits are grown on semiconductor materials. High harmonics generated and measured in these materials can be used to spatially image the circuit. When the circuit is off, the measured pattern reflects the shape and location of the semiconductor devices in the circuit. The circuit geometry can be reconstructed from the pattern by employing available algorithms. When the circuit is on, the electric fields modify the pattern. Subsequently comparison of this pattern to the "off pattern" allows the algorithm to reconstruct the distribution and magnitude of the electric fields in the circuit. The spatial resolution of the method is limited by the wavelength of the harmonics, approximately 100 nm. Those skilled in the art will realize that imaging can be made active as follows: The harmonic generation process (which is much faster than any electrical switching speed) can be delayed frame by frame to make a movie of the field as a function of time. Hence, this method allows the direct 2D imaging of the instantaneous magnitude and temporal/spatial propagation profile of electric fields in an active circuit. Presently, there is no method that can measure the chip internal fields. It is potentially relevant for gaining greater insight into operation of integrated circuits and for developing more precise electronic simulation tools and models. Additionally, direct observation of charge transfer and electronic dynamics in photovoltaic cells and transistors through monolithic integration of attosecond spectroscope in semiconductor substrate can facilitate development of new photovoltaic cells that are more efficient, and transistors that switch faster.

One disclosed embodiment of the present invention provides a method for probing nano-plasmonic response in devices on semiconductor substrates: In a nano-plasmonic device, electric fields propagate along the interface between a semiconductor and a metal, mostly permeating the semiconductor. Harmonics generated from this substrate and subsequently modulated by the plasmonic electric field can be used to probe the plasmonic waves and measure the electric field of a propagating plasmon. These devices can be useful in engineering plasmonic devices or for tracking parasitic effects/losses in circuits. No such devices currently exist.

One disclosed embodiment of the present invention provides a method for measuring the time-dependent field of an optical pulses such as, for example, a laser pulse, if the optical pulse is used as the perturbing electric field, i.e., the control field is another optical pulse. The field of the optical pulse can then be measured by the measurements of emitted harmonics. To date, only one alternative method can perform a similar action, but it is much slower, operationally more expensive requiring instruments such as, for example, vacuum chambers and electron energy analyzers more expensive, and requires approximately hundred to a thousand times more laser energy. On the other hand, a device based on a semiconductor generating medium will be compact, cheap, fast (possibly even capable of measuring single pulses) and will require much less laser power. No other methods currently exist that can measure the electric field of light pulses. The semiconductor device will find utility in application requiring generation of short laser pulses. Additionally, measuring the electric field of the light will be increasingly relevant for the telecommunication industry with growth towards optical communication and transport.

One disclosed embodiment of the present invention provides a method to control high-harmonic emission in space and time. Accordingly control field may be applied through internal terminals such as, for example, a surface of a semiconductor medium may be patterned with thin electrodes that convey DC or AC fields into the semiconductor-laser interaction region of intense ionizing pulse (i.e. intense laser pulse), thereby suitably modifying the propagation of the harmonics. The control field may comprise DC or AC pulsed electrical signals, applied through internal or external terminals. This presents an extremely powerful and convenient method to control harmonic light to use, for example, for probing other systems and/or implementing functionalities such as, for example, focusing/defocusing, raster scanning and beam splitting. Although conventional optical mirrors are available to steer visible light, vacuum-ultraviolet radiation requires costly solutions. Furthermore, each mirror is often designed to perform one single operation such as, for example, specular reflection, focusing, beam splitting. The disclosed method, in accordance to one embodiment of the present invention may perform multiple tasks at once.

One disclosed embodiment of the present invention provides a laser source delivering ultraviolet frequency comb by means of high-harmonic generation in a semiconductor substrate. Controlling the spectral properties of the laser beam enables tuning the period of the harmonic frequency comb, thus offering operational flexibility. Furthermore, due to the low laser energy required to produce the harmonics, nano-antennas deposited directly on the semiconductor may further reduce the threshold to laser intensities available with laser frequency combs. Much effort has been devoted to produce soft X-ray frequency combs with high-harmonic generation in gases. The methods disclosed in accordance to one aspect of the present invention enable the generation of optical, ultraviolet and vacuum ultraviolet frequency comb directly in a semiconductor medium. This opens the possibility of co-integration of an ultra-precise metrology and diagnostic functionalities with optical, electronic and microfluidic components monolithically fabricated in a single microsystem.

One disclosed embodiment of the present invention enables monolithic integration of ultra-precise XUV spectroscopic functionality with micro fluidics and lab-on-chip components.

EXAMPLES

Example 1

Experimental Setup

A disclosed embodiment provides an experimental set up for generating high harmonics in semiconductor crystal using, for example, a MIR laser source centered around approximately 3.7 µm (central wavelength of 3.7 µm) and with approximately 19 µJ energy. The pulse duration of approximately 85 fs is measured with a dispersion-free SHG FROG. In accordance to one embodiment, the beam is spatially filtered with a pin-hole and focused with, for example, a f/30 spherical Ag mirror onto an epitaxially grown 500 nm thin film of a single crystal of wurtzite ZnO(0001) deposited on a 0.5 mm Sapphire(0001) substrate. The optical axis of both crystals is aligned parallel to the laser k-vector. The focus size is measured with knife-edge technique. The generated harmonics are refocused with a Al mirror onto a VIS-UV spectrometer. The second-harmonic control field is generated in a 300 µm AGS2 crystal optimized for Type-I SHG right after the pin-hole to exploit the high intensity and high beam quality. It is separated and then recombined before the focusing mirror with dichroic beam splitter that reflects the second-harmonic control field. Its polarization is rotated with a broadband λ/2 before recombination. The delay between the two color fields is scanned with a PZT stage on the second-harmonic control field arm.

All documents, patents, journal articles and other materials cited in the present application are incorporated herein by reference.

Having described the various embodiments of the present invention in detail, it will be apparent that modifications and variations are possible without departing from the scope of the invention defined in the appended claims. Furthermore, it should be appreciated that all examples in the present disclosure, while illustrating many embodiments of the invention, are provided as non-limiting examples and are, therefore, not to be taken as limiting the various aspects so illustrated.

REFERENCES

The following references are referred to above and/or describe technology that may be used with the present invention and contents and disclosure of the following references are incorporated herein by reference:
1. Corkum. P. B. A plasma perspective on strong field multiphoton ionization. Phys. Rev. Lett. 71, 19941997 (1993).
2. L'Huillier, A. & Balcou, P. High-order harmonic generation in rare gases with a 1-ps 1053-nm laser. Phys. Rev. Lett. 70, 774777 (1993).
3. Spielmann, Ch. et al. Generation of coherent soft X-rays in the water Window using 5-fcmtosecond laser pulses. Science 278, 661-664 (1997).
4. Goulielmakis. E. et al. Single-cycle nonlinear optics. Science 320, J 61 4-161 7 (2008).
5. Itatani, J. et al. Tomographic imaging of molecular orbitals. Nature 432, 86771 (2004).
6. Ghimire, S. et al. Observation of high-order harmonic generation in a bulk crystal. Nature physics 7, 138-141 (2011).
7. Schubert, O., et al. Sub-cycle control of terahertz high-harmonic generation by dynamical Bloch oscillations. Nature Photonics 8, 119-123 (2014)
8. Dudovich, N. et al. Measuring and controlling the birth of attosecond X UV pulses. Nature Physics 2, 781 786 (2006).
9. He, X. et al. Interference effects in two-color high-order harmonic generation. Physical Review A 82, 033410 (2010).
10. Ulstrup S. et al. Ultrafast dynamics of massive Dirac fermions in bilayer graphene. Phys. Rev. Lett. 112, 257401 (2014).
11. Keldysh, L. Ionization in the field of a strong electromagnetic wave. Sov. Phys. JETP 20. 1307-1314 (1965).
12. Corkum, P. & Krausz, F. Attosecond Science. Nature Phys. 3. 381 87 (2007).
13. Wömer, H. J. Bertrand, J. B., Kartashov. D. V Corkum, P. B. & Villeneuve, D. M. Following a chemical reaction using high-harmonic interferometry. Nature 466, 604-607 (2010).
14. Smirnova, O. et al. High harmonics interferometry of multi-electron dynamics in molecules. Nature 460, 972-977 (2009).
15. Brunel, F. Harmonic generation due to plasma effects in a gas undergoing multiphoton ionization in the high-intensity limit. JOSA B 7, 521-526 (1990).
16. Kemper, F., Moritz, B., Freerick, J. K., & Devereaux, T. P. Theoretical description of high-order harmonic generation in solids, New Journal of Physics 15, 023003 (2013).
17. Mücke, O. D. Isolated high-order harmonics puls4e from two-color-driven Block oscillations in bulk semiconductors. Phys. Rev. B 84, 081202 (2011).
18. Golde, D., Meier, T., and Koch, S. High harmonics generated in semiconductor nanostructures by the coupled dynamics of optical inter- and intraband excitations. Phys. Rev. B 77, 075330 (2008).
19. Vampa G. et al. Theoretical analysis of high harmonic generation in solids. Phys. Rev. Lett. 113, 073901 (2014).
20. Wirth, et al. Synthesized light transients. Science 334, 195-200 (2011).
21. Krausz, F & Stockman, M. I. Attosecond metrology: from electron capture to future signal processing. Nature Photonics 8, 205-213 (2014).
22. Shafir. D. et al. Resolving the time when an electron exits a tunnelling barrier. Nature 485, 343-346 (2012)
23. Hawkins, P. G. & Ivanov, M. Y. Role of subcycle transition dynamics in high-order-harmonic generation in periodic structures. Phys. Rev. A 87, 063842 (2013).
24. Schiffrin, A. et al. Optical-field induced currents in dielectrics. Nature 493, 70-74 (2013)).

What is claimed:
1. A method comprising:
applying a driving electromagnetic field having a first frequency and a first intensity to a solid-state medium to thereby trigger a high harmonic generation process in the solid-state medium,
wherein the high harmonic generation process results in a generation of a harmonic beam from the solid-state medium,
wherein the harmonic beam comprises a plurality of high-order harmonics of the first frequency; and
applying a control field having a second frequency, a second intensity and a relative phase with respect to the driving electromagnetic field to an interaction region of the electromagnetic field and the solid-state medium to thereby control one or more spectral, temporal and spatial properties of the harmonic beam generated from the solid-state medium.

2. A method of claim 1, wherein varying the second intensity of the control field modulates a spectrum of the high harmonic generation process in the solid-state medium.

3. A method of claim 1, wherein varying the relative phase of the control field as a function of a harmonic order, modulates an intensity of a respective high-order harmonic of the first frequency generated from the solid-state medium.

4. A method of claim 1, wherein, the solid-state medium has a crystalline structure.

5. A method of claim 1, wherein, the solid-state medium is a semiconductor material.

6. A method of claim 1, wherein, the solid-state medium is a dielectric material.

7. A method of claim 1, where the solid-state medium is a polymer material.

8. A method of claim 1, wherein the solid-state medium is a biological material.

9. A method of claim 8, wherein the solid-state medium is a thin slice of a biological material.

10. A method of claim 1 wherein the second frequency of the control field is a second-harmonic of the first frequency of the driving electromagnetic field.

11. A method of claim 1, wherein the driving electromagnetic field comprises a laser field.

12. An apparatus comprising:
a semiconductor-based medium comprising a semiconductor-laser interaction region;
a first input configured to focus a drive laser field onto the semiconductor-laser interaction region to thereby initiate a high harmonic generation process in the semiconductor-laser interaction region;

a second adjustable input for introducing a control field onto the semiconductor-laser interaction region to thereby control the high harmonic generation process, wherein the control field spatially and temporally overlaps the drive laser field; and an output for directing a signal generated from the semiconductor-laser interaction region onto one or more terminals, wherein the signal comprises one or more high harmonics.

13. An apparatus of claim 12, wherein the terminals are internal or external terminals.

14. The apparatus of claim 12, wherein the control field is applied through electrodes fashioned internally on the semiconductor generation medium.

15. The apparatus of claim 12, wherein the control field is applied by an external source.

16. The apparatus of claim 12, wherein the control field is a laser field.

17. The apparatus of claim 12, wherein the control field comprises DC field.

18. The apparatus of claim 12, wherein the control field comprises AC field.

19. The apparatus of claim 12, wherein the control field comprises a pulsed electrical signal.

20. The apparatus of claim 12, wherein the drive laser field comprises a laser pulse.

21. The apparatus of claim 12, wherein the adjustable input comprises adjusting an intensity of the control field.

22. The apparatus of claim 12, wherein the adjustable input comprises adjusting a delay of the control field relative to the drive laser field.

23. The apparatus of claim 12, wherein the one or more high energy attosecond pulses are in an ultraviolet to soft x-ray frequency regime.

* * * * *